United States Patent [19]

Yamamichi et al.

[11] Patent Number: 5,366,920
[45] Date of Patent: Nov. 22, 1994

[54] METHOD FOR FABRICATING A THIN FILM CAPACITOR

[75] Inventors: Shintaro Yamamichi; Hirohito Watanabe; Toshiki Hashimoto; Toshiyuki Sakuma, all of Tokyo, Japan

[73] Assignee: NEC Corporation, Tokyo, Japan

[21] Appl. No.: 229,423

[22] Filed: Apr. 12, 1994

[30] Foreign Application Priority Data

Apr. 12, 1993 [JP] Japan .................................. 5-083684

[51] Int. Cl.⁵ ..................... H01L 21/70; H01L 27/00
[52] U.S. Cl. ........................................ 437/52; 437/60; 437/919; 257/295; 365/145
[58] Field of Search ............... 437/47, 52, 60, 919; 257/295, 306, 310; 365/84, 98, 145, 65, 149, 129, 132, 148; 361/313

[56] References Cited

U.S. PATENT DOCUMENTS 5,081,559  1/1992  Fazan et al. ..................... 361/313
5,192,704  3/1993  McDavid et al. ................. 437/52
5,227,855  7/1993  Momose .......................... 365/145

OTHER PUBLICATIONS

By T. Ema et al., "3-Dimensional Stacked Capacitor Cell for 16M and 64M Drams", IEEE, International Electron Devices Meeting Digest of Technical Papers, 1988, pp. 592–595.

Primary Examiner—Olik Chaudhuri
Assistant Examiner—H. Jey Tsai
Attorney, Agent, or Firm—Young & Thompson

[57] ABSTRACT

A thin film capacitor which comprises a lower electrode, a dielectric film and an upper electrode is fabricated on a substrate. The lower electrode is not provided by etching process using a photoresist mask, but it is provided by providing an aperture thorough an insulating layer deposited on the substrate, and depositing a conductive film on the bottom of the aperture and connected to a lower interconnection provided on the bottom of the aperture. Consequently, no convex protrusion is found at the processed edge of the lower electrode.

11 Claims, 9 Drawing Sheets

- 206 PHOTORESIST
- 205 SOG
- 204 Si₃N₄
- 202 SiO₂
- 203 POLYSILICON
- 201 SILICON SUBSTRATE

212 APERTURE  212

- 212
- 207
- 208
- 207 Pt FILM
- 208 Ta FILM

209 SOG

209

209, 205

212  207  208  212  204

- 211 AL/TiN
- 207, 208
- 204
- 202
- 201
- 210 BST FILM
- 203

- 305 PHOTORESIST
- 304 SOG
- 302 SiO₂
- 303 POLYSILICON
- 301 SILICON SUBSTRATE

- 311 APERTURE
- 311

- 309 BST FILM
- 306 Pt FILM
- 307 Ta FILM

- 308 SOG

- 308
- 304

- 308
- 304

- 304  311  311  309
- 306
- 307

- 309  306  307  310 Al/TiN
- 304
- 302
- 301
- 303

- 406 PHOTORESIST
- 405 SOG
- 404 $Si_3N_4$
- 402 $SiO_2$
- 403 POLYSILICON
- 401 SILICON SUBSTRATE

412 APERTURE

- 410 BST FILM
- 407 Pt FILM
- 408 Ta FILM

409 SOG

411 Al/TiN

- 505 PHOTORESIST
- 504 SOG
- 502 SiO₂
- 503 POLYSILICON
- 501 SILICON SUBSTRATE

- 512 APERTURE
- 512

- 509 TiN
- 509
- 508
- 506
- 507
- 508 BST FILM
- 506 Pt FILM
- 507 Ta FILM

- 510 SOG

- 510
- 504

- 510
- 504

- 509, 512, 508, 506, 507, 512, 504

- 509, 508, 511 Al/TiN
- 504
- 502
- 501
- 506, 507, 503

METHOD FOR FABRICATING A THIN FILM CAPACITOR

FIELD OF THE INVENTION

The invention relates to a method for fabricating a thin film capacitor, and more particularly, to a publication method in which a thin film capacitor used for an integrated circuit is obtained.

BACKGROUND OF THE INVENTION

A conventional thin film capacitor used for an integrated circuit is of a stacked structure in which electrodes are formed of polysilicon. Such thin film capacitors are fabricated to provide capacitor cells subsequently to the formation of transistors and bit lines in a dynamic random access memory, as described on pages 592 to 595 of "International Electron Devices Meeting Digest of Technical Papers, 1988". In the conventional thin film capacitor, there is limitation in the reduction of an area for a capacitor region which is recently required for higher integration of an integrated circuit. Therefore, the area of the capacitor region must be effectively reduced in accordance with the adoption of three-dimensional structureand thin and high dielectric constant films to be used for thin film capacitors. Consequently, silicon oxide films and silicon nitride films having dielectric constants of approximately 7 at most are used for dielectric films of thin film capacitors. Therefore, silicon oxide films must be very thin to be less than 10 nm in thickness to realize a capacitance value as required. On the other hand, leakage current is increased as the thickness of a dielectric film is reduced. For this reason, it is difficult to realize a thickness of dielectric films having a current-voltage characteristics, by which the leakage current is suppressed to be less than a tolerable value. In other words, the leakage current is increased, because the thickness of dielectric films is reduced at the edge of a lower electrode, and electric field is converged thereat, even if an area of an electrode is effectively increased by using cubit structure.

In this situation, it has been proposed that a thickness of dielectric films is made highly thick by using a dielectric material having a dielectric constant represented, for instance, by $SrTiO_3$ of a dielectric constant as large as 300 at the room temperature, and $(Ba, Sr)TiO_3$, $Pb(Zr, Ti)O_3$, $Pb(Mg, Nb)O_3$, and $Pb(Mg, W)O_3$ having much larger dielectric constants, so that the leakage current is avoided to flow therethrough. In case where the above described dielectric material having a high dielectric constant is deposited as a film directly on silicon for a lower electrode, the silicon is diffused to the interface between the dielectric film and silicon dioxide ($SiO_2$) which is a low dielectric constant layer in oxidation atmosphere. In order to avoid this disadvantage, it is considered that the lower electrode is made of Pt/Ta, Pt/Ti or RuOx.

In the conventional thin film capacitor, however, there are disadvantages that a thickness of the high dielectric constant film is reduced at the edge of the lower electrode which is made by a predetermined configuration and the leakage current is inevitably increased due to the convergence of electric field, even if the lower electrode is made of Pt/Ta, Pt/Ti or RuOx. This is because processed residual occurs on side walls of a resist as a mask used for dryetching to carry out fine patterning, when the dielectric film of the high dielectric constant and the lower electrode of Pt/Ta, etc. are patterned by using the resist, so that minute convex and concave configuration is resulted on the periphery of a processed pattern even after the removal of the resist. Consequently, mass-productivity and reproducibility are lowered.

SUMMARY OF THE INVENTION

Accordingly, it is an object of the invention to provide a method for fabricating a thin film capacitor, by which leakage current is lowered in a fabricated thin film capacitor.

It is a further object of the invention to provide a method for fabricating a thin film capacitor, in which convex and concave configuration on a lower electrode is suppressed to occur.

It is a still further object of the invention to provide a method for fabricating a thin film capacitor, by which mass-productivity and reproducibility are increased.

According to the invention, a method for fabricating a thin film capacitor, comprises the steps of forming a first insulating layer on a substrate; providing a first aperture through the first insulating layer on a region for defining the thin film capacitor; filling the first aperture with a conductive material for a lower interconnection to be connected to the substrate; forming a second insulating layer on the first insulating layer and the conductive material in the first aperture, the second insulating layer being made flat on a surface thereof; providing a second aperture through the second insulating layer to expose the conductive material for the lower interconnection; depositing a conductive film for a lower electrode on a bottom of the second aperture and on the second insulating layer; covering the conductive film on the bottom of the second aperture and the second insulating layer with a third insulating layer, removing the third insulating layer, the conductive film on the second insulating layer, and the second insulating layer to expose the conductive film on the bottom of the second aperture, an exposed surface of the conductive film for the lower electrode being coplaner with a removed surface of the second insulating layer; depositing a dielectric film on the conductive film for the lower electrode; and depositing a conductive film for an upper electrode on the dielectric film.

BRIEF DESCRIPTION OF THE DRAWINGS

The invention will be explained in more detail in conjunction with appended drawings, wherein.

DESCRIPTION OF THE PREFERRED EMBODIMENTS

A method for fabricating a thin film capacitor in the first preferred embodiment according to the invention will be explained in FIGS. 1A to 1H.

Figure 1A:
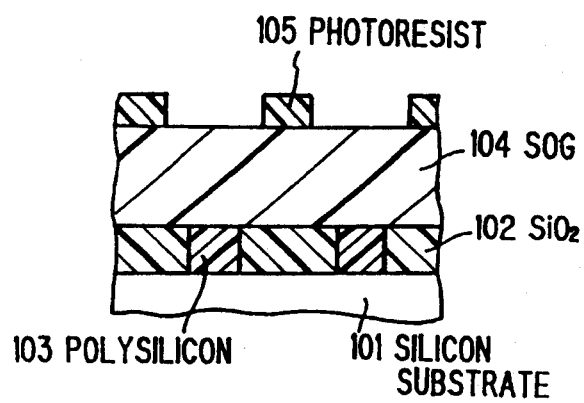
FIGS. 1A to 1H are cross-sectional views showing a method for fabricating a thin film capacitor in a first preferred embodiment according to the invention.

In FIG. 1A, a $SiO_2$ layer 102 having a thickness of 300 nm is formed on the surface of a silicon substrate 101 having a resistivity of 0.01 Ωcm by thermal oxidation, and contact holes are apertured through the $SiO_2$ layer 102. Then, the contact holes are buried with polysilicon 103 by removing polysilicon grown on areas other than the contact holes by etching back thereof. Thereafter, Spin On Glass (SOG) 104 is coated thereon by a thickness of 1 μm, and a pattern of a photoresist 105 is provided on the SOG 104.

Figure 1E:
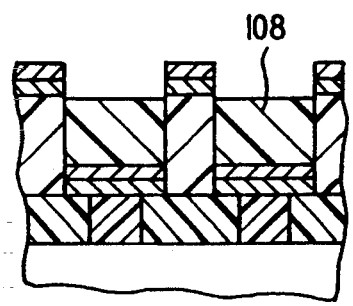
Figure 1B:
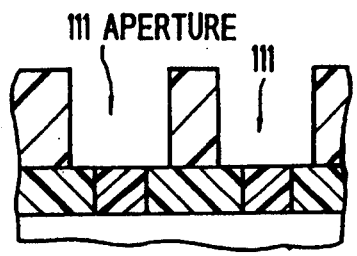

In FIG. 1B, apertures 111 are provided by processing the SOG 104 in accordance with the pattern of the photoresist 105 to be used as a mask.

Figure 1F:
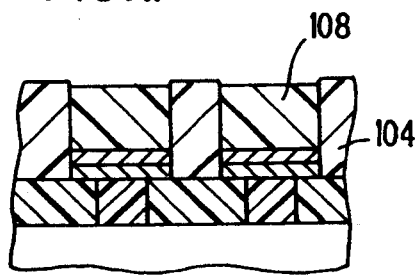
Figure 1C:
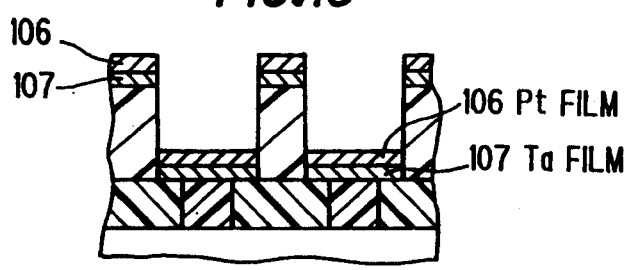

In FIG. 1C, a two-layered film of Pt 106 having a thickness of 50 nm and Ta 107 having a thickness of 50 nm is deposited to be a lower electrode by DC magnetron sputtering. The sputtering is poor in covering step difference areas, so that the deposition is slightly held on the side walls of the apertures 111, but appropriately on the capacitor formation regions of the contact holes buried with polysilicon 103 and the top surface of the SOG 104. Then, isotropic etching is carried out for five minutes to remove Pt/Ta slightly deposited on the side walls of the apertures 111 by using Ar gas and HBr gas.

Figure 1G:
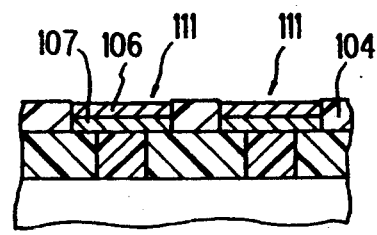
Figure 1D:
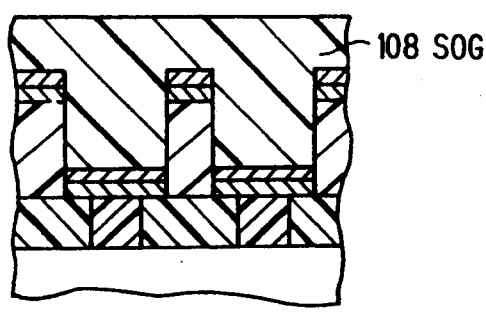

In FIG. 1D, SOG 108 is coated on the stepped surface to provide a flat surface thereon.

In FIG. 1E, the SOG 108 is etched back to expose the Pt and Ta films 106 on the SOG 104.

In FIG. 1F, the exposed Pt film 106 and the Ta film 107 therebelow and on the SOG 104 are removed by using aqua regia.

In FIG. 1G, the SOGs 104 and 108 are further etched back to expose the Pt film 106 on the capacitor formation regions.

Figure 1H:
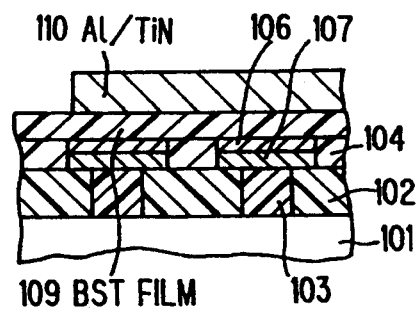

In FIG. 1H, a $(Ba_{0.5}, Sr_{0.5})TiO_3$ (BST) film 109 having a thickness of 100 nm which is a dielectric film of a high dielectric constant is grown on the etched-back surface by the ion bean sputter (IBS) method under the condition that a temperature of the substrate 101 is 600° C., a beam voltage is 1000 V, and a beam current is 40 mA, and an upper electrode interconnection 110 is provided on the BST film 109 in accordance with the deposition of a TiN film having a thickness of 50 nm and Al film having a thickness of 1 μm by the DC magnetron sputtering.

In the conventional method, the coating of the SOG 104 is not carried out, and the Pt/Ta films 106 and 107 are directly deposited on the whole surface on the substrate 101 processed with $SiO_2$ and polysilicon 102 and 103. Then, the Pt/Ta films 106 and 107 are etched to be a predetermined pattern by a mask of photoresist. Consequently, minute convex protrusions are formed at the edges of processed edges of the Pt/Ta films 106 and 107 for the lower electrodes in accordance with the influence of depositions on the side walls of the photoresist, so that portions of the BST film 111 become thin to result in the flow of leakage current due to the electric field convergence on the thin portion.

In the invention, however, the Pt/Ta films 106 and 107 for the lower electrodes are formed exclusively on the capacitor regions in the self-alignment manner by the mask of SOG 104, so that no convex protrusion is formed at the edges of the Pt/Ta films 106 and 107 by eliminating the etching process of fine patterns.

Figure 2:
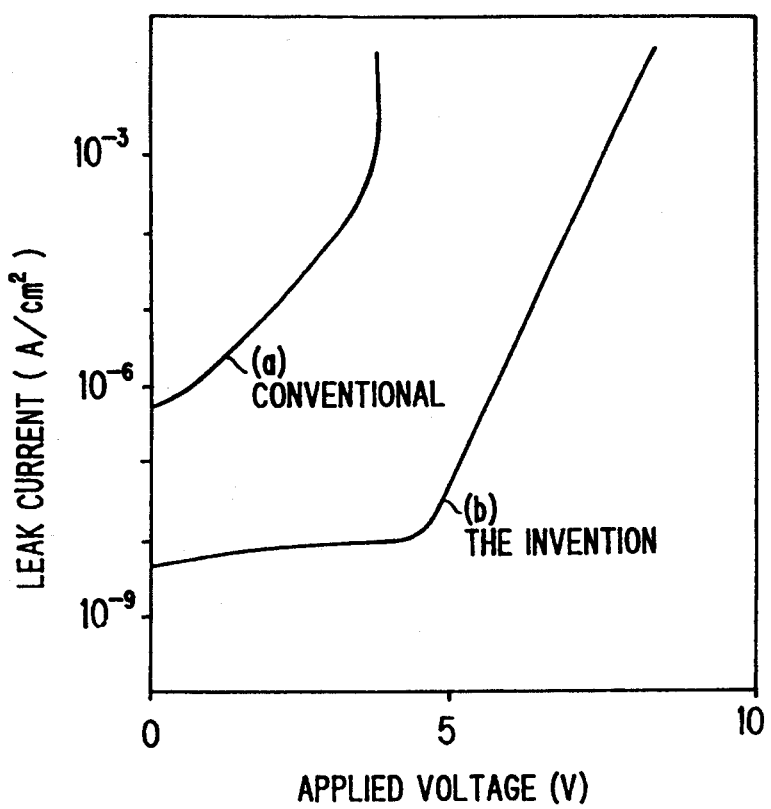
FIG. 2 is a graph explaining the difference of leakage currents to applied voltages between thin film capacitors fabricated in the invention and the conventional method.

FIG. 2 shows the comparison of leakage currents relative to applied voltages between thin film capacitors fabricated in the invention and in the conventional method, wherein the curve (a) is for the conventional method, and the curve (b) is for the invention. As clearly shown therein, the leakage current property is much improved in the invention as compared to the conventional method.

A method for fabricating a thin film capacitor in the second preferred embodiment according to the invention will be explained in FIGS. 3A to 3H.

Figure 3A:
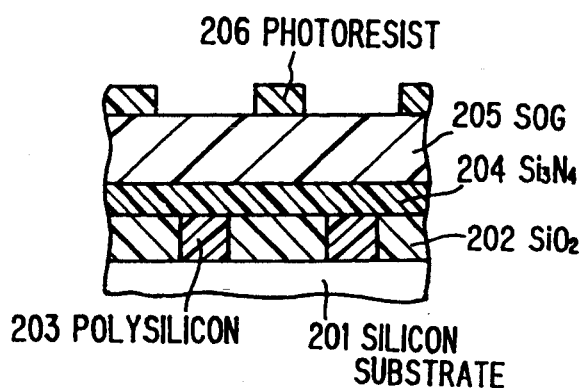
FIGS. 3A to 3H, 4A to 4H, 5A to 5H, 6A to 6H and 7A to 7H are cross-sectional views showing method for fabricating a thin film capacitor in second to sixth preferred embodiments according to the invention.

In FIG. 3A, a $SiO_2$ layer 202 having a thickness of 300 nm is formed on a silicon substrate 201 having a resistivity of 0.01 Ωcm in accordance with thermal oxidation, and contact holes are apertured through the $SiO_2$ layer 202 by a predetermined pattern. Then, the contact holes are buried with polysilicon 203, the remaining portion of which is removed by an etching-back process. Next, a $Si_3N_4$ layer 204 having a thickness of 100 nm for an interface insulating layer is formed to be equal in thickness to a lower electrode by the LPCVD method, and a SOG layer 205 having a thickness of 1 μm and an etching rate different from (much faster than) that of $Si_3N_4$ is coated on the $Si_3N_4$ layer 204.

Thereafter, a pattern of photoresist 206 is provided on the SOG layer 205.

Figure 3B:
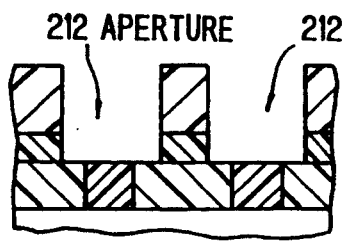

In FIG. 3B, the SOG and $Si_3N_4$ layers 205 and 204 are processed to have apertures 212 on capacitor formation regions by using a mask of the photoresist 206.

Figure 3C:
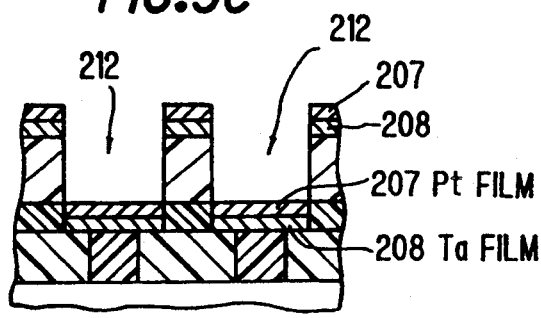

In FIG. 3C, a Pt layer 207 having a thickness of 50 nm and a Ta layer 208 having a thickness of 50 nm for lower electrodes are deposited by the DC magnetron sputtering. As described in the first preferred embodiment, the deposition on the side walls of the apertures 212 is slightly observed.

Thus, the deposition is removed in accordance with the isotropic etching for five minutes by using Ar gas and HBr gas.

Figure 3D:
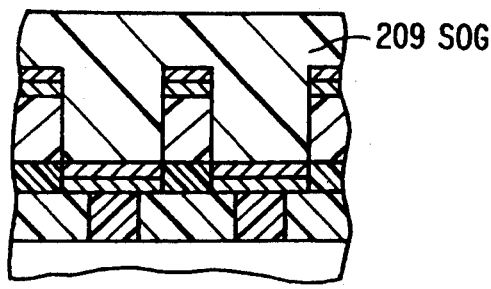

In FIG. 3D, a SOG layer 209 is coated to provide a flat surface.

Figure 3E:
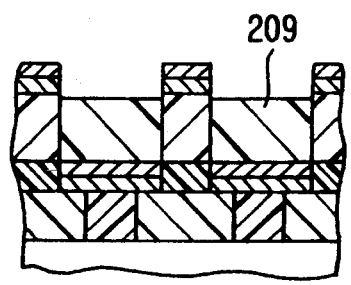

In FIG. 3E, the SOG layer 209 is etched back to expose the Pt and Ta films 207 and 208.

Figure 3F:
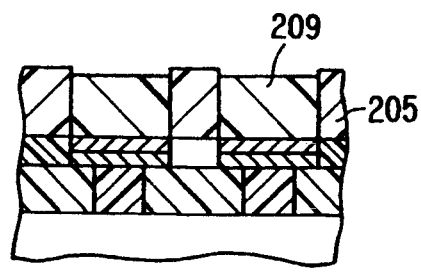

In FIG. 3F, the exposed Pt and Ta films 207 and 208 are removed by an etching process using aqua regia.

Figure 3G:
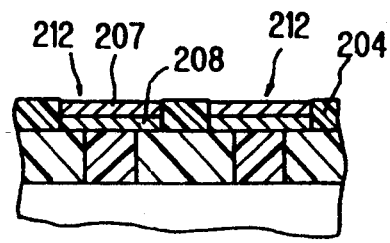

In FIG. 3G, the SOG layers 205 and 209 are selectively etched to be removed by a vapor phase treatment of hydrofluoric acid. Thus, the Pt film 207 is exposed on the capacitor formation regions, while the $Si_3N_4$ film 204 having a much lower etching rate is left as shown therein.

Figure 3H:
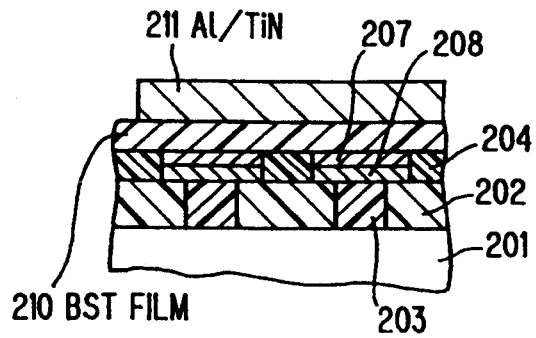

In FIG. 3H, a $(Ba_{0.5}, Sr_{0.5})TiO_2$ (BST) film 210 having a thickness of 100 nm for a capacitor dielectric layer is deposited under the condition of a substrate temperature of 600° C., a beam voltage of 1000 V, and a beam current of 40 mA by the ion beam sputtering, and an Al film having a thickness of 1 μm and TiN film having a thickness of 50 nm are deposited thereon by the DC magnetron sputtering. Then, the Al/TiN films are processed to provide a predetermined pattern for an upper electrode and interconnection 211.

In the thin film capacitor fabricated in the second preferred embodiment, no convex protrusion is found at the edges of the lower electrodes. Further, the SOG layer is completely removed, because the $Si_3N_4$ layer is deposited to be equal in thickness to the lower electrode. As a result, better reproducibility is obtained in the second preferred embodiment than in the first preferred embodiment. The leakage current property is the same as in the first preferred embodiment as shown in FIG. 2.

A method for fabricating in thin film capacitor in the third preferred embodiment according to the invention will be explained in FIGS. 4A to 4H.

Figure 4A:
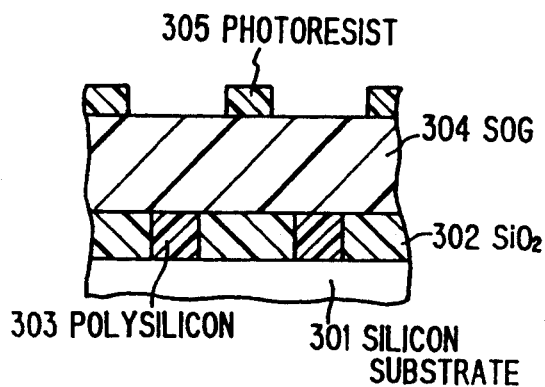

In FIG. 4A, a SiO$_2$ layer 302 having a thickness of 300 nm if formed on the surface of a silicon substrate 301 having a resistivity of 0.01 Ωcm, and contact holes are formed through the SiO$_2$ layer 302 by a predetermined pattern. Then, the deposition of polysilicon 303 is carried out thereon, so that the contact holes are buried with polysilicon 303, and the remaining portion of the polysilicon is etched-back to be removed to provide a flat surface thereon. Next, a SOG layer 304 having a thickness of 1 μm is coated thereon, and a pattern of photoresist 305 is provided on the coated SOG layer 304.

Figure 4B:
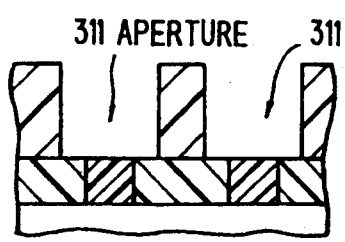

In FIG. 4B, apertures 311 are formed through the SOG layer 304 on capacitor formation regions by a mask of the photoresist 305.

Figure 4C:
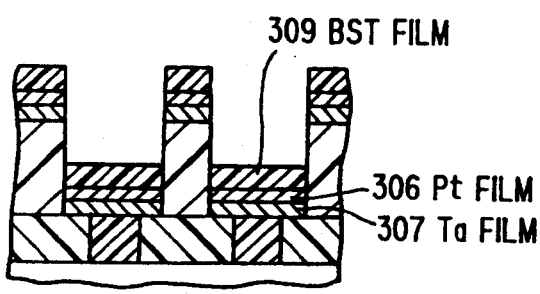

In FIG. 4C, a Pt film 306 having a thickness of 50 nm and a Ta film 307 having a thickness of 50 nm are deposited for lower electrodes by the DC magnetron sputtering. As explained in the first and second preferred embodiments, the slight deposition of Pt/Ta on the side walls of the apertures are removed in the isotropic etching for five minutes by Ar gas and HBr gas. Then, the deposition of (Ba$_{0.5}$, Sr$_{0.5}$)TiO$_3$ (BST) film 309 having a thickness of 100 nm is carried out for capacitor dielectric films under the condition of a substrate temperature of 600° C., a beam voltage of 1000 V, a beam current of 40 mA by the ion beam sputtering.

Figure 4D:
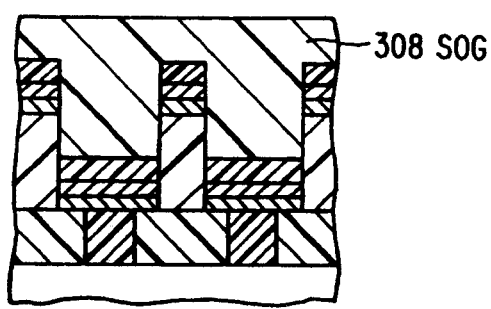

In FIG. 4D, a SOG layer 308 is formed thereon to be flattened on the top surface thereof.

Figure 4E:
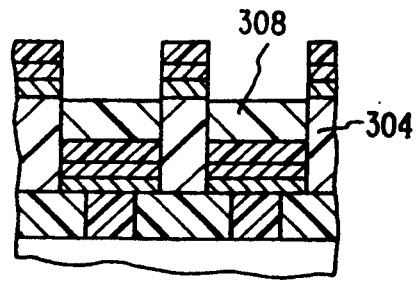

In FIG. 4E, the etching-back of the SOG layer 308 is carried out to expose the BST film 309 on the SOG layer 304.

Figure 4F:
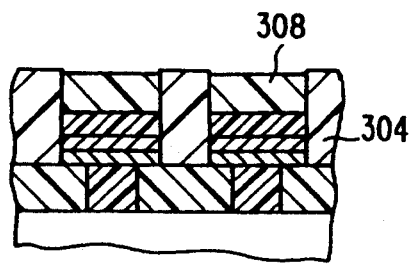

In FIG. 4F, the exposed BST film 309 is removed by nitrofluorine acid, and the Pt/Ta films 306 and 307 on the SOG layer 304 are then removed by aqua regia.

Figure 4G:
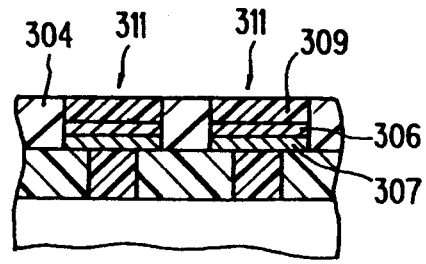

In FIG. 4G, the SOG layers 304 and 308 are etched-back to be removed so as to expose the BST film 309 on the capacitor formation regions.

Figure 4H:
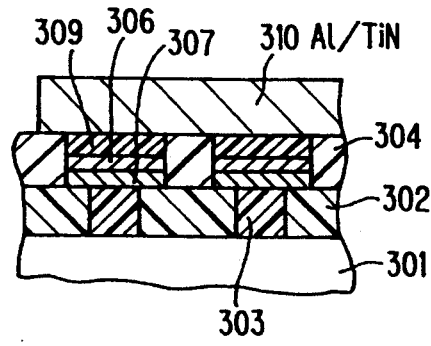

In FIG. 4H, and Al film having a thickness of 1 μm and a TiN film having a thickness of 50 nm are deposited thereon by the DC magnetron sputtering, and the deposited Al and TiN films are processed to a predetermined pattern for an upper electrode and interconnection 310.

A capacitance value of a thin film capacitor fabricated in the conventional method is smaller than a designed value, because the aforementioned convex protrusions are formed at the edges of the BST films.

In the invention, the etching process for lower electrodes and dielectric films is unnecessary to suppress the disadvantages in the conventional method.

A method for fabricating a thin film capacitor in the fourth preferred embodiment according to the invention will be explained in FIGS. 5A to 5H.

Figure 5A:
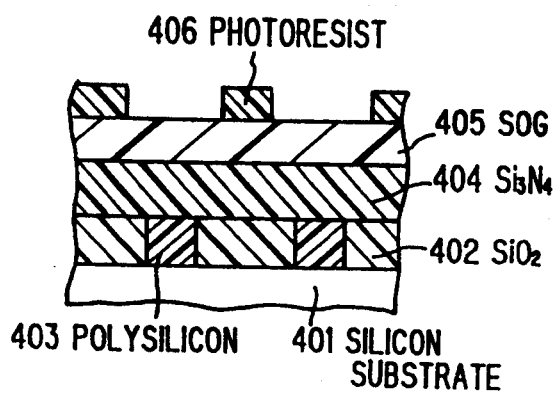

In FIG. 5A, a SiO$_2$ layer 402 having a thickness of 300 nm is formed on the surface of a silicon substrate 401 having a resistivity of 0.01 Ωcm, and contact holes are formed through the SiO$_2$ layer 402 by a predetermined pattern. Then, the deposition of polysilicon 403 is carried out thereon, so that the contact holes are buried with polysilicon 403, and the remaining portion of the polysilicon is etched-back to be removed to provide a flat surface thereon. Next, a Si$_3$N$_4$ film 404 for an interface insulating film having a thickness of 200 nm is deposited to be equal to a thickness of a lower electrode and a dielectric film and a SOG layer 405 having a thickness of 1 μm is coated thereon. Then, a pattern of photoresist 406 is provided on the coated SOG layer 405.

Figure 5B:
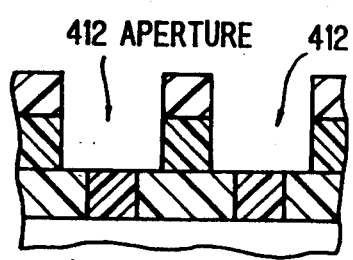

In FIG. 5B, apertures 412 are formed through the Si$_3$N$_4$ film 404 and the SOG layer 405 on capacitor formation regions by a mask of the photoresist 406.

Figure 5C:
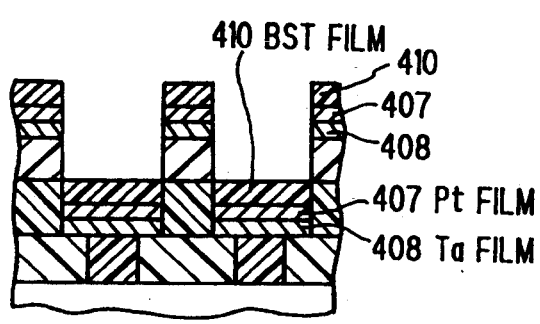

In FIG. 5C, a Pt film 407 having a thickness of 50 nm and a Ta film 408 having a thickness of 50 nm are deposited for lower electrodes by the DC magnetron sputtering. As explained in the first to third preferred embodiments, the slight deposition of Pt/Ta on the side walls of the apertures 412 are removed in the isotropic etching for five minutes by Ar gas and HBr gas. Then, the deposition of (Ba$_{0.5}$, Sr$_{0.5}$)TiO$_3$ (BST) film 410 having a thickness of 100 nm is carried out for capacitor dielectric films under the condition of a substrate temperature of 600° C., a beam voltage of 1000 V, a beam current of 40 mA by the ion beam sputtering.

Figure 5D:
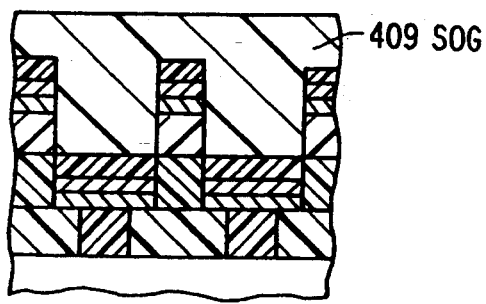

In FIG. 5D, a SOG layer 409 is formed thereon to be flattened on the top surface thereof.

Figure 5E:
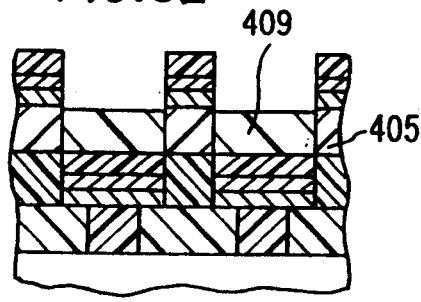

In FIG. 5E, the etching-back of the SOG layer 409 is carried out to expose the BST film 410 on the SOG layer 405.

Figure 5F:
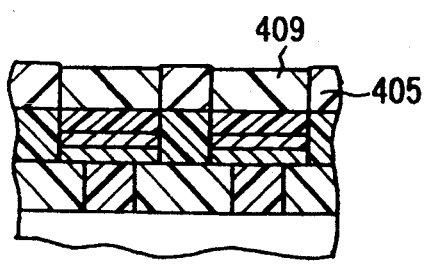

In FIG. 5F, the exposed BST film 410 is removed by nitrofluorine acid, and the Pt/Ta films 407 and 408 on the SOG layer 405 are then removed by aqua regia.

Figure 5G:
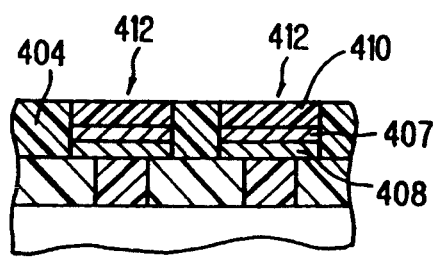

In FIG. 5G, the SOG layers 405 and 409 are etched-back to be removed so as to expose the BST film 410 on the capacitor formation regions by vapor phase treatment of fluorine acid.

Figure 5H:
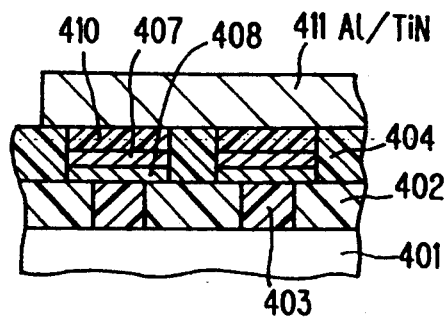

In FIG. 5H, an Al film having a thickness of 1 μm and a TiN film having a thickness of 50 nm are deposited thereon by the DC magnetron sputtering, and the deposited Al and TiN films are processed to a predetermined pattern for an upper electrode and interconnection 411.

In the fourth preferred embodiment, no convex protrusion is found at the edges of the lower electrodes. Further, the Si$_3$N$_4$ layer is deposited by a thickness equal to the total thickness of the lower electrode and the dielectric film, so that the SOG layer is completely removed by vapor phase treatment of fluorine acid. As a result, reproducibility is better than in the third preferred embodiment is obtained. The leakage current property is obtained as shown in FIG. 2 by the curve (b).

A method for fabricating a thin film capacitor in the fifth preferred embodiment according to the invention will be explained in FIGS. 6A to 6H.

Figure 6A:
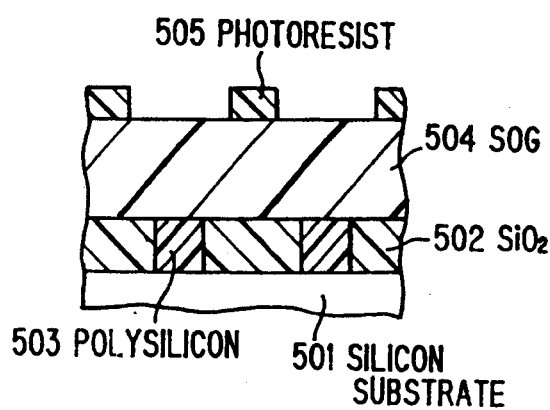

In FIG. 6A, a SiO$_2$ layer 502 having a thickness of 300 nm is formed on the surface of a silicon substrate 501 having a resistivity of 0.01 Ωcm, and contact holes are formed through the SiO$_2$ layer 502 by a predetermined pattern. Then, the deposition of polysilicon 503 is carried out thereon, so that the contact holes are buried with polysilicon 503, and the remaining portion of the polysilicon is etched-back to be removed so as to provide a flat surface thereon.

Next, a SOG layer 504 having a thickness of 1 μm is coated thereon, and a pattern of photoresist 505 is provided on the coated SOG layer 504.

Figure 6B:
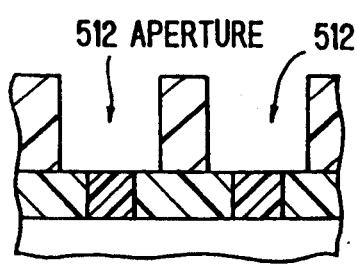

In FIG. 6B, apertures 512 are formed through the SOG layer 504 on capacitor formation regions by a mask of the photoresist 505.

Figure 6C:
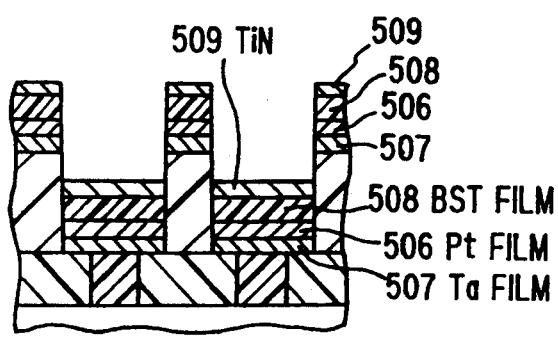

In FIG. 6C, a Pt film 506 having a thickness of 50 nm and a Ta film 507 having a thickness of 50 nm are deposited for lower electrodes by the DC magnetron sputtering. As explained in the first to fifth preferred embodiments, the slight deposition of Pt/Ta on the side walls of the apertures 512 are removed in the isotropic etching for five minutes by Ar gas and HBr gas. Then, the deposition of $(Ba_{0.5}, Sr_{0.5})TiO_3$ (BST) film 508 having a thickness of 100 nm is carried out for capacitor dielectric films under the condition of a substrate temperature of 600° C., a beam voltage of 1000 V, a beam current of 40 mA by the ion beam sputtering. Then, a TiN film 509 having 508 thickness of 50 nm is deposited on the BST film 508 by the reactive DC magnetron sputtering.

Figure 6D:
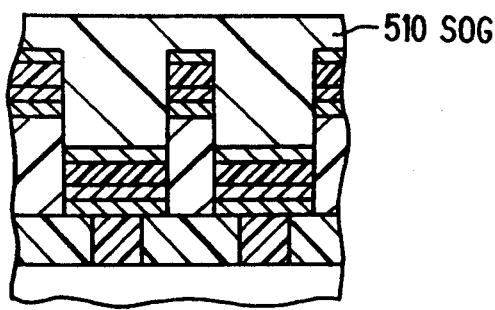

In FIG. 6D, a SOG layer 510 is formed thereon to be flattened on the top surface thereof.

Figure 6E:
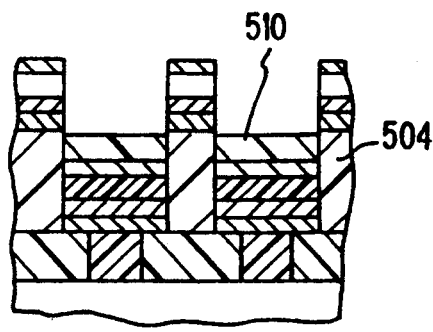

In FIG. 6E, the etching-back of the SOG layer 510 is carried out to expose the TiN film 509, the BST film 508, Pt film 506 and the Ta film 507 on the SOG layer 304.

Figure 6F:
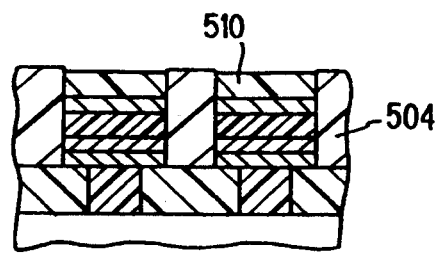

In FIG. 6F, the exposed TiN film 509 is etched by mixed solution of $NH_3$ and $H_2O_2$, the BST film 508 is etched by nitrofluorine acid, and the Pt/Ta films 506 and 507 on the SOG layer 504 are then etched by aqua regia.

Figure 6G:
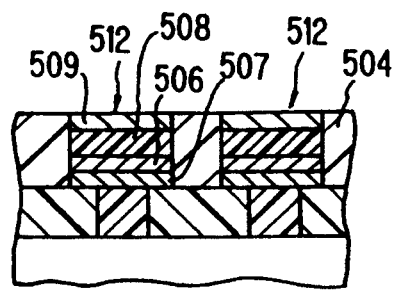

In FIG. 6G, the SOG layers 504 and 510 are etched-back to be removed so as to expose the TiN film 509 for upper electrodes on the capacitor formation regions.

Figure 6H:
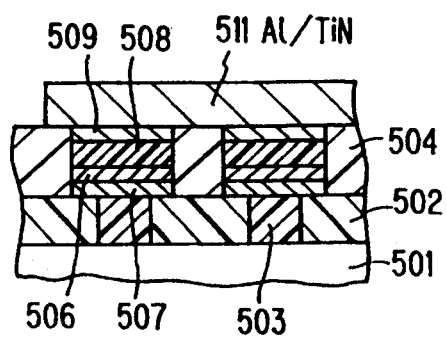

In FIG. 6H, a TiN film having a thickness of 50 nm and an Al film having a thickness of 1 μm are deposited thereon by the DC magnetron sputtering, and the deposited Al and TiN films are processed to a predetermined pattern for an electrode and interconnection layer 511.

In the conventional method, the coating of the SOG layer 504 is not carried out, and the lower electrode of Pt/Ta is etched to be patterned by a mask of photoresist. As a result, convex protrusions are formed at the processed edges of the lower electrodes in accordance with undesired depositions on side walls of the photoresist. This makes the BST films thinner partially to result in the convergence of the electric field leading to the flow of leakage current. Further, the BST film is also etched to result in the disadvantage in which a capacitance value becomes lower than a designed value.

The above disadvantages are overcome in the invention as explained in the former preferred embodiments.

A method for fabricating a thin film capacitor in the sixth preferred embodiment according to the invention will be explained in FIGS. 7A to 7H.

Figure 7A:
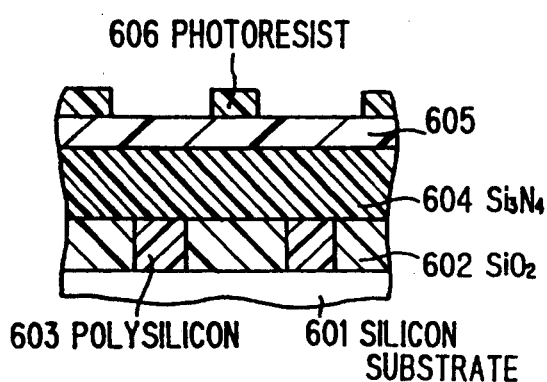

In FIG. 7A, a $SiO_2$ layer 602 having a thickness of 300 nm is formed on the surface of a silicon substrate 601 having a resistivity of 0.01 Ωcm, and contact holes are formed through the $SiO_2$ layer 602 by a predetermined pattern. Then, the deposition of polysilicon 603 is carried out thereon, so that the contact holes are buried with polysilicon 603, and the remaining portion of the polysilicon is etched-back to be removed to provide a flat surface thereon. Next, a $Si_3N_4$ film 604 having a thickness of 250 nm is deposited to be equal to a total thickness of a lower electrode, a capacitor dielectric film and an upper electrode by the LPCVD method, and a SOG layer 605 having a thickness of 1 μm is coated thereon. Then, a pattern of photoresist 606 is provided on the coated SOG layer 605.

Figure 7E:
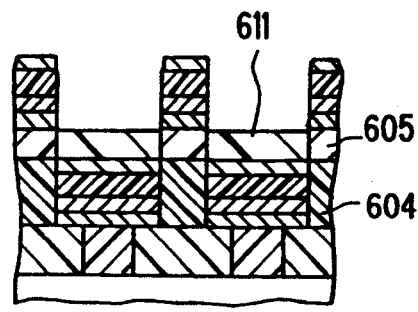
Figure 7B:
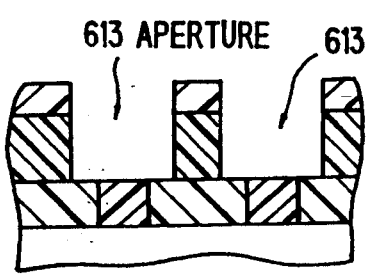

In FIG. 7B, apertures 613 are formed through the $Si_3N_4$ film 604 and the SOG layer 605 on capacitor formation regions by a mask of the photoresist 606.

Figure 7F:
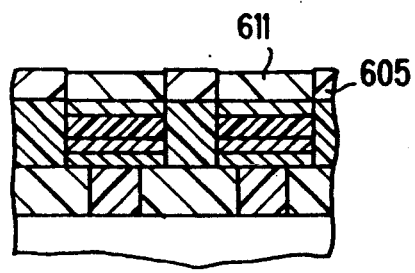
Figure 7C:
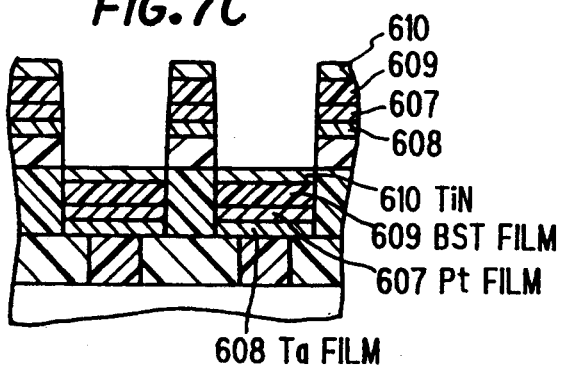

In FIG. 7C, a Pt film 607 having a thickness of 50 nm and a Ta film 608 having a thickness of 50 nm are deposited for lower electrodes by the sputtering. As explained in the first to fifth preferred embodiments, the slight deposition of Pt/Ta on the side walls of the apertures 613 are removed in the isotropic etching for five minutes by Ar gas and HBr gas. Then, the deposition of $(Ba_{0.5}, Sr_{0.5})TiO_3$ (BST) film 609 having a thickness of 100 nm is carried out for capacitor dielectric films under the condition of a substrate temperature of 600° C., a beam voltage of 1000 V, a beam current of 40 mA by the ion beam sputtering. Further, a TiN film 610 for upper electrodes having a thickness of 50 nm is deposited by the reactive DC magnetron sputtering.

Figure 7G:
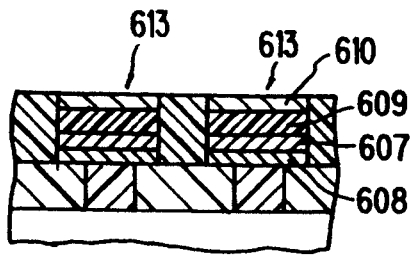
Figure 7D:
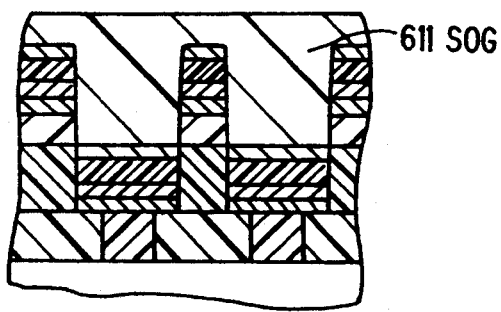

In FIG. 7D, a SOG layer 611 is formed thereon to be flattened on the top surface thereof.

In FIG. 7E, the etching-back of the SOG layer 611 is carried out to expose the TiN, BST, Pt and Ta depositions 610, 609, 608 and 607 on the SOG layer 605.

In FIG. 7F, the exposed TiN 610 is removed by hydrogen peroxide water solution with $NH_9$, the BST film 609 is removed by nitrofluorine acid, and the Pt/Ta films 608 and 607 on the SOG layer 605 are then removed by aqua regia.

In FIG. 7G, the SOG layers 605 and 611 are etched-back to be removed so as to expose the TiN film 610 on the capacitor formation regions.

Figure 7H:
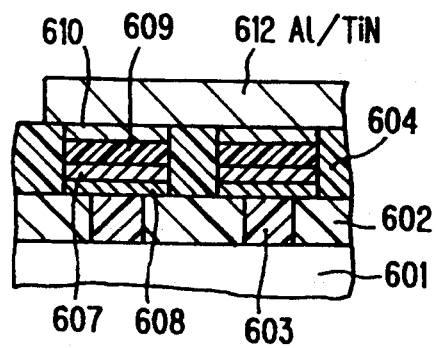

In FIG. 7H, a TiN film having a thickness of 50 nm and an Al film having a thickness of 1 μm are deposited thereon by the DC magnetron sputtering, and the deposited Al and TiN films are processed to be a predetermined pattern for an electrode and interconnection 612.

In this preferred embodiment, no convex protrusion is found at the processed edges of the lower electrodes. Further, the $Si_3N_4$ film is deposited to be equal in thickness to the combination of the lower electrode, the dielectric film and the upper electrode, so that the SOG layer is completely removed by the vapor phase treatment of fluorine acid. Consequently, reproducibillity is obtained better than in the fifth preferred embodiment. The leakage current property is obtained with the same result as shown in FIG. 2.

A method for fabricating a thin film capacitor in the seventh preferred embodiment according to the invention will be explained in FIGS. 8A to 8H.

Figure 8A:
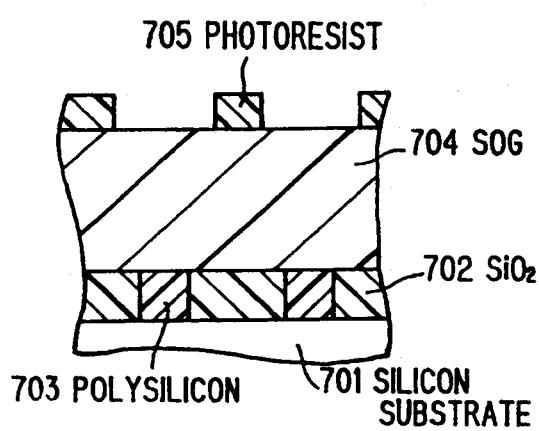
FIGS. 8A to 8E and 9A to 9E are cross-sectional views showing seventh and eighth preferred embodiments according to the invention.

In FIG. 8A, a $SiO_4$ layer 702 having a thickness of 300 nm is formed on the surface of a silicon substrate 701 having a resistivity of 0.01 Ωcm, and contact holes are formed through the $SiO_2$ layer 702 by a predetermined pattern. Then, the deposition of polysilicon 703 is carried out thereon, so that the contact holes are buried with polysilicon 703, and the remaining portion of the polysilicon is etched-back to be removed so as to provide a flat surface thereon.

Next, a SOG layer 704 having a thickness of 1 μm is coated thereon, and a pattern of photoresist 705 is provided on the coated SOG layer 704.

Figure 8D:
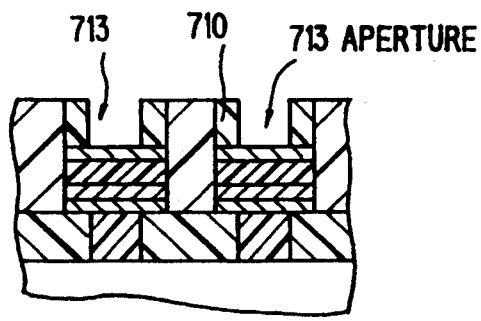
Figure 8B:
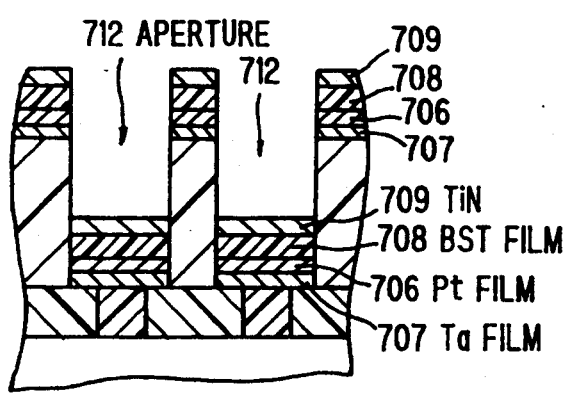

In FIG. 8B, apertures 712 are formed through the SOG layer 704 on capacitor formation regions by a mask of the photoresist 705. Thereafter, a Pt film 706 having a thickness of 50 nm and a Ta film 707 having a thickness of 50 nm are deposited for lower electrodes by sputtering. As explained in the first to sixth preferred embodiments, the slight deposition of Pt/Ta on the side walls of the apertures 712 are removed in the isotropic etching for five minutes by Ar gas and HBr gas. Then, the deposition of (Ba$_{0.5}$, Sr$_{0.5}$)TiO$_3$ (BST) film 708 having a thickness of 100 nm is carried out for capacitor dielectric films under the condition of a substrate temperature of 600° C., a beam voltage of 1000 V, a beam current of 40 mA by the ion beam sputtering. Further, a TiN film 709 having a thickness of 50 nm is deposited by the reactive DC magnetron sputtering.

Figure 8E:
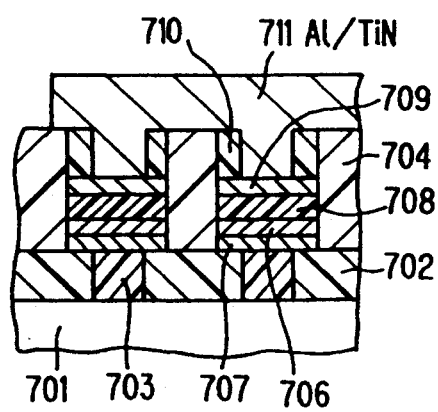
Figure 8C:
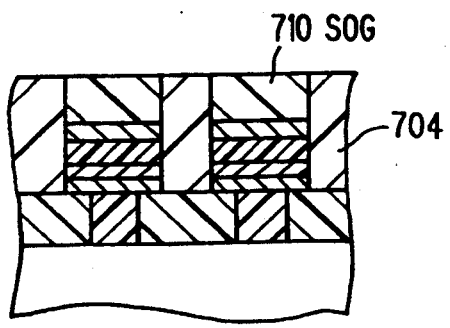

In FIG. 8C, a SOG layer 710 is formed thereon to be flattened on the top surface thereof. Then, the etching-back of the SOG layer 710 is carried out to expose the TiN, BST, Pt and Ta films 709, 708, 706 and 707 on the SOG layer 704. Then, the exposed TiN 709 is etched to be removed by hydrogen peroxide water solution of NH$_3$, the BST film 708 is etched to be removed by nitrofluorine acid, and the Pt/Ta films 706 and 707 on the SOG layer 704 are then removed by aqua regia.

In FIG. 8D, apertures 713 are formed through the SOG layer 710 to expose the TiN film 709.

In FIG. 8E, a TiN film having a thickness of 50 nm and an Al film having a thickness of 1 μm are deposited by the DC magnetron sputtering, and the deposited films are processed to be a predetermined pattern for an electrode and interconnection layer 711.

In the seventh preferred embodiment, an advantage in which ununiform removal of the SOG layer tending to occur in the sixth preferred embodiment is eliminated is obtained, because the apertures 713 are formed through the SOG layer 710 remaining unremoved. As a matter of course, the advantages in the first to sixth preferred embodiments are also obtained.

A method for fabricating a thin film capacitor in the eighth preferred embodiment according to the invention will be explained in FIGS. 9A to 9H.

Figure 9A:
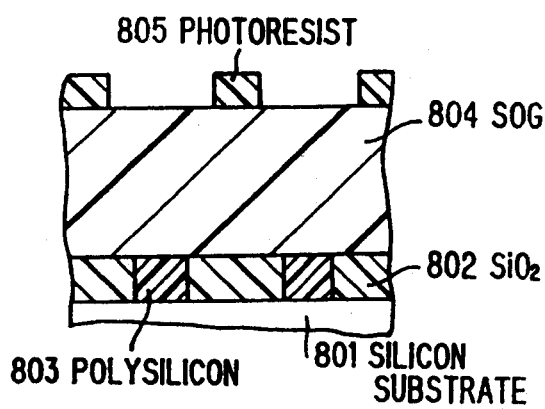

In FIG. 9A, a SiO$_2$ layer 802 having a thickness of 300 nm is formed on the surface of a silicon substrate 801 having a resistivity of 0.01 Ωcm, and contact holes are formed through the SiO$_2$ layer 802 by a predetermined pattern. Then, the deposition of polysilicon 803 is carried out thereon, so that the contact holes are buried with polysilicon 803, and the remaining portion of the polysilicon is etched-back to be removed so as to provide a flat surface thereon.

Next, a SOG layer 804 having a thickness of 1 μm is coated thereon, and a pattern of photoresist 805 is provided on the coated SOG layer 804.

Figure 9D:
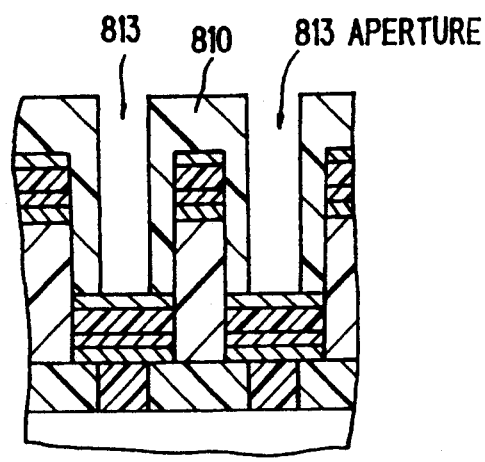
Figure 9B:
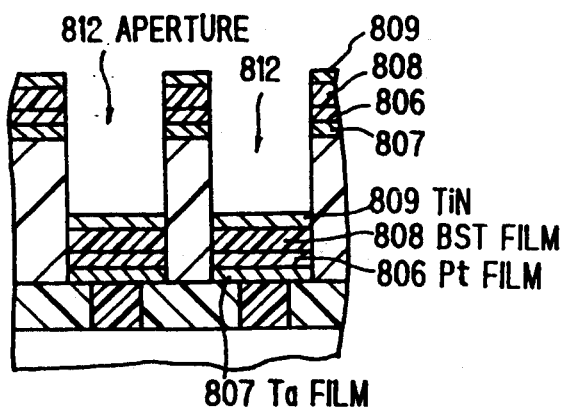

In FIG. 9B, apertures 812 are formed through the SOG layer 804 on capacitor formation regions by a mask of the photoresist 805. Then, a Pt film 806 having a thickness of 50 nm and a Ta film 807 having a thickness of 50 nm are deposited for lower electrodes by DC magnetron sputtering. As explained in the first to seventh preferred embodiments, the slight deposition of Pt/Ta on the side walls of the apertures 812 are removed in the isotropic etching for five minutes by Ar gas and HBr gas. Then, the deposition of (Ba$_{0.5}$, Sr$_{0.5}$)TiO$_3$ (BST) film 808 having a thickness of 100 nm is carried out for capacitor dielectric films under the condition of a substrate temperature of 600° C., a beam voltage of 1000 V, a beam current of 40 mA by the ion beam sputtering. Further, a TiN film 809 having a thickness of 50 nm for upper electrode is deposited by the reactive DC magnetron sputtering.

Figure 9E:
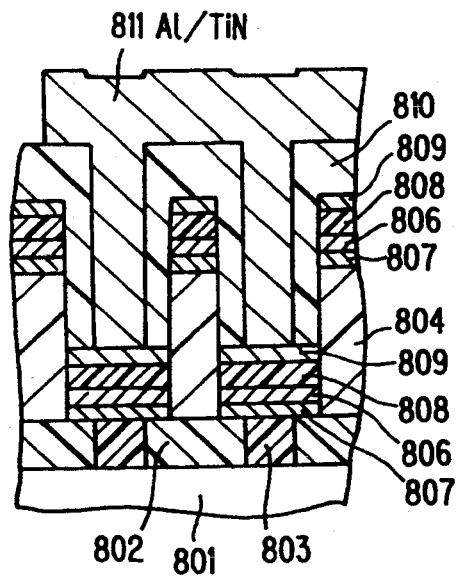
Figure 9C:
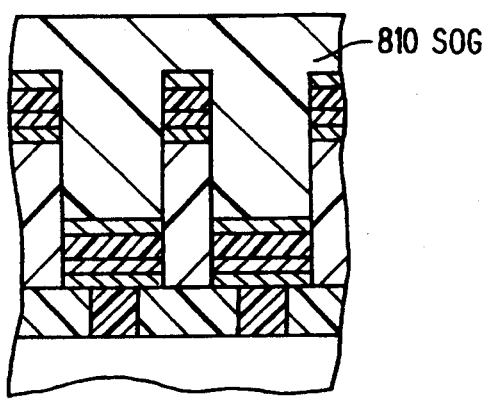

In FIG. 9C, a SOG layer 810 is formed thereon to be flattened on the top surface thereof.

In FIG. 9D, apertures 813 are formed through the SOG layer 810 on the capacitor formation regions.

In FIG. 9E, a TiN film having a thickness of 50 nm and an Al film having a thickness of 1 μm are deposited by the DC magnetron sputtering, and the deposited films are processed to be a predetermined pattern which will be an electrode and interconnection layer 811.

In the eighth preferred embodiment, the same advantage as in the seventh preferred embodiment is obtained. Especially, yield is improved in fabrication. Further, process is simplified to enhance mass-productivity as compared to the seventh preferred embodiment, because there is no necessity to remove the TiN/BST/Pt/Ta films.

In the first to eighth preferred embodiments, (Ba$_{0.5}$, Sr$_{0.5}$)TiO$_3$ may be replaced for a material having a high dielectric constant by a chemical formula of ABO$_3$, where A is at least one material selected from Ba, Sr, Pb, La, Li and K, and B is at least one material selected from Zr, Ti, Ta, Nb, Mg, Mn, Fe, Zn and W. For this purpose, SrTiO$_3$, PbTiO$_3$, Pb (Zr, Ti)O$_3$, (Pb, La)(Zr, Ti)O$_3$, Pb(Mg, Nb)O$_3$, Pb(Mg, W)O$_3$, Pb(Zn, Nb)O$_3$, LiTaO$_3$, LiNbO$_3$, KTaO$_3$, and KNbO$_3$ are listed. In addition, Ta$_2$O$_3$, Bi$_4$Ti$_3$O$_{12}$, BaMgF$_4$, etc. having the other chemical formulas may be used.

In the first to eighth preferred embodiments, when the capacitors thus fabricated are capacitor elements in a DRAM, the polysilicon layers 103, 203, 303, 403, 503, 603, 703, and 803 are connected to n-type regions for ones of sources and drains of switching transistors fabricated in the silicon substrate.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A method for fabricating a thin film capacitor, comprising the steps of:

forming a first insulating layer on a substrate;

providing a first aperture through said first insulating layer on a region for defining said thin film capacitor;

filling said first aperture with a conductive material for a lower interconnection to be connected to said substrate;

forming a second insulating layer on said first insulating layer and said conductive material in said first aperture, said second insulating layer being made flat on a surface thereof;

providing a second aperture through said second insulating layer to expose said conductive material for said lower interconnection;

depositing a conductive film for a lower electrode on a bottom of said second aperture and on said second insulating layer;

covering said conductive film on said bottom of said second aperture and said second insulating layer with a third insulating layer, removing said third insulating layer, said conductive film on said second insulating layer, and said second insulating layer to expose said conductive film on said bottom of said second aperture, an exposed surface of said conductive film for said lower electrode being coplanar with a removed surface of said second insulating layer;

depositing a dielectric film on said conductive film for said lower electrode; and depositing a conductive film for an upper electrode on said dielectric film.

2. A method for fabricating a thin film capacitor, according to claim 1, wherein:
said step of removing comprises, the steps of:
removing said third insulating layer to expose said conductive film not deposited on said bottom of said second aperture but on said second insulating layer;
removing said conductive film on said second insulating layer; and
removing said third insulating layer in said second aperture, and said second insulating layer to expose said conductive film on said bottom of said second aperture.

3. A method for fabricating a thin film capacitor, according to claim 1, wherein:
said substrate is a silicon substrate;
said first insulating layer is $SiO_2$;
said second and third insulating layers are SOG;
said conductive material for lower interconnection is polysilicon;
said conductive film for said lower electrode is of Pt and Ta films;
said dielectric film is $(Ba_{0.5}, Sr_{0.5})TiO_3$; and
said conductive film for upper electrode is of Al and TiN.

4. A method for fabricating a thin film capacitor, according to claim 1, wherein:
said second insulating layer comprises a fourth insulating layer deposited on said first insulating layer to be equal in thickness to said conductive film for said lower electrode, and a fifth insulating layer deposited on said fourth insulating layer.

5. A method for fabricating a thin film capacitor, according to claim 4, wherein:
said fourth insulating layer is $Si_3N_4$; and
said fifth insulating layer is SOG.

6. A method for fabricating a thin film capacitor, comprising the steps of:
forming a first insulating layer on a substrate;
providing a first aperture through said first insulating layer on a region for defining said thin film capacitor;
filling said first aperture with a conductive material for a lower interconnection to be connected to said substrate;
forming a second insulating layer on said first insulating layer and said conductive material in said first aperture, said second insulating layer being made flat on a surface thereof;
providing a second aperture through said second insulating layer to expose said conductive material for said lower interconnection;
depositing a conductive film for a lower electrode on a bottom of said second aperture and on said second insulating layer;
depositing a dielectric film on said conductive film for said lower electrode;
covering said dielectric film on said conductive film for said lower electrode on said bottom of said second aperture and said second insulating layer with a third insulating layer, removing said third insulating layer, said dielectric film on said conductive film on said second insulating layer, and said second insulating layer to expose said dielectric film on said conductive film for said lower electrode on said bottom of said second aperture, an exposed surface of said dielectric film for said lower electrode being coplanar with a removed surface of said second insulating layer; and
depositing a conductive film for an upper electrode on said dielectric film.

7. A method for fabricating a thin film capacitor, according to claim 6, wherein:
said second insulating layer comprises a fourth insulating layer deposited on said first insulating layer to be equal in thickness to a combination of said conductive film for said lower electrode and said dielectric film.

8. A method for fabricating a thin film capacitor, comprising the steps of:
forming a first insulating layer on a substrate;
providing a first aperture through said first insulating layer on a region for defining said thin film capacitor;
filling said first aperture with a conductive material for a lower interconnection to be connected to said substrate;
forming a second insulating layer on said first insulating layer and said conductive material in said first aperture, said second insulating layer being made flat on a surface thereof;
providing a second aperture through said second insulating layer to expose said conductive material for said lower interconnection;
depositing a conductive film for a lower electrode on a bottom of said second aperture and on said second insulating layer;
depositing a dielectric film on said conductive film for said lower electrode;
depositing a conductive film for an upper electrode on said dielectric film:
covering said conductive film for said upper electrode on said dielectric film and said conductive film for said lower electrode on said bottom of said second aperture and said second insulating layer with a third insulating layer, removing said third insulating layer, said conductive film for said upper electrode, said dielectric film and said conductive film for said lower electrode successively deposited on said second insulating layer, and said second insulating layer to expose said conductive film for said upper electrode deposited on said dielectric film on said conductive film for said lower electrode on said bottom of said second aperture, an exposed surface of said conductive film for said upper electrode being coplanar with a removed surface of said second insulating layer; and
depositing a conductive film for an upper interconnection on said conductive film for said upper electrode.

9. A method for fabricating a thin film capacitor, according to claim 8, wherein:
said second insulating layer comprises a fourth insulating layer deposited on said first insulating layer to be equal in thickness to a combination of said conductive films for said upper and lower electrodes and said dielectric film, and a fifth insulating layer deposited on said fourth insulating layer.

10. A method for fabricating a thin film capacitor, comprising the steps of:
forming a first insulating layer on a substrate;
providing a first aperture through said first insulating layer on a region for defining said thin film capacitor;

filling said first aperture with a conductive material for a lower interconnection to be connected to said substrate;

forming a second insulating layer on said first insulating layer and said conductive material in said first aperture, said second insulating layer being made flat on a surface thereof;

providing a second aperture through said second insulating layer to expose said conductive material for said lower interconnection;

depositing a conductive film for a lower electrode on a bottom of said second aperture and said second insulating layer;

depositing a dielectric film on said conductive film for said lower electrode;

depositing a conductive film for an upper electrode on said dielectric film;

covering said conductive film for said upper electrode on said dielectric film and said conductive film for said lower electrode on said bottom of said second aperture and said second insulating layer with a third insulating layer, providing a third aperture through said third insulating layer to expose said conductive film for said upper electrode deposited in said second aperture; and depositing a conductive film for an upper interconnection to be filled into said third aperture and connected to said conductive film for said upper electrode.

11. A method for fabricating a thin film capacitor, according to claim 10, further comprising the steps of:

removing said third insulating layer, said conductive film for said upper electrode, said dielectric film and said conductive film for said conductive film for said lower electrode successively deposited on said second insulating layer, and said second insulating layer to make removed surfaces of said second and third insulating layers flat; and providing said third aperture through said third insulating layer thus made flat on said removed surface.

* * * * *